(12) United States Patent
Shiokawa

(10) Patent No.: US 11,211,552 B2
(45) Date of Patent: Dec. 28, 2021

(54) SPIN-ORBIT TORQUE MAGNETORESISTANCE EFFECT ELEMENT AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 139 days.

(21) Appl. No.: 16/645,055

(22) PCT Filed: May 13, 2019

(86) PCT No.: PCT/JP2019/018897
§ 371 (c)(1),
(2) Date: Mar. 6, 2020

(87) PCT Pub. No.: WO2019/230351
PCT Pub. Date: Dec. 5, 2019

(65) Prior Publication Data
US 2021/0013398 A1 Jan. 14, 2021

(30) Foreign Application Priority Data
May 31, 2018 (JP) .............................. JP2018-105392

(51) Int. Cl.
*H01L 43/04* (2006.01)
*H01F 10/32* (2006.01)
(Continued)

(52) U.S. Cl.
CPC ........... *H01L 43/04* (2013.01); *H01F 10/329* (2013.01); *H01L 27/228* (2013.01); *H01L 43/06* (2013.01);
(Continued)

(58) Field of Classification Search
CPC ....... H01L 43/04; H01L 27/228; H01L 43/06; H01L 43/10; H01F 10/329; H01F 10/3272; H01F 10/3281
(Continued)

(56) References Cited

U.S. PATENT DOCUMENTS 9,025,371 B1   5/2015  Huai et al.
10,854,258 B2 * 12/2020 Shiokawa ............... H01L 43/02
(Continued)

FOREIGN PATENT DOCUMENTS

JP          2017-216286 A     12/2017

OTHER PUBLICATIONS

Jul. 30, 2019 International Search Report issued in International Patent Application No. PCT/JP2019/018897.

*Primary Examiner* — Jami Valentine Miller
(74) *Attorney, Agent, or Firm* — Oliff PLC

(57) ABSTRACT

This spin-orbit torque magnetoresistance effect element includes: a first ferromagnetic layer; a second ferromagnetic layer; a non-magnetic layer positioned between the first ferromagnetic layer and the second ferromagnetic layer; and a spin-orbit torque wiring on which the first ferromagnetic layer is laminated, wherein the spin-orbit torque wiring extends in a second direction crossing a first direction which is an orthogonal direction of the first ferromagnetic layer, the first ferromagnetic layer includes a first laminate structure and an interfacial magnetic layer in order from the spin-orbit torque wiring side, the first laminate structure is a structure obtained by arranging a ferromagnetic conductor layer and an oxide-containing layer in order from the spin-orbit torque wiring side, the ferromagnetic conductor layer includes a ferromagnetic metal element, and the oxide-containing layer includes an oxide of a ferromagnetic metal element.

20 Claims, 6 Drawing Sheets

(51) Int. Cl.
*H01L 27/22* (2006.01)
*H01L 43/06* (2006.01)
*H01L 43/10* (2006.01)

(52) U.S. Cl.
CPC ...... *H01F 10/3272* (2013.01); *H01F 10/3281* (2013.01); *H01L 43/10* (2013.01)

(58) Field of Classification Search
USPC ........................................................ 257/427
See application file for complete search history.

(56) References Cited

U.S. PATENT DOCUMENTS

| | | | |
|---|---|---|---|
| 2017/0033281 A1* | 2/2017 | Hu | H01L 43/10 |
| 2018/0123026 A1* | 5/2018 | Sasaki | H01F 10/3286 |
| 2020/0066968 A1* | 2/2020 | Park | H01F 10/329 |
| 2020/0136017 A1* | 4/2020 | Ashida | H01F 41/32 |
| 2020/0278403 A1* | 9/2020 | Shiokawa | H01L 43/04 |

* cited by examiner

SPIN-ORBIT TORQUE MAGNETORESISTANCE EFFECT ELEMENT AND MAGNETIC MEMORY

TECHNICAL FIELD

The present invention relates to a spin-orbit torque magnetoresistance effect element and a magnetic memory.

The present application claims priority on Japanese Patent Application No. 2018-105392 filed on May 31, 2018, the content of which is incorporated herein by reference.

BACKGROUND ART

Giant magnetoresistance (GMR) elements formed of a multilayer film consisting of a ferromagnetic layer and a non-magnetic layer and tunneling magnetoresistance (TMR) elements using insulating layers (a tunnel barrier layer or a barrier layer) for a non-magnetic layer are known as magnetoresistance effect elements. Generally, TMR elements have a higher element resistance and a higher magentoresistive (MR) ratio than those of GMR elements. For this reason, TMR elements are attracting attention as magnetic sensors, high frequency components, magnetic heads, and elements for nonvolatile random access memories (MRAMs).

Data is read from and written in MRAMs using the characteristics in which the element resistance of a TMR element changes if mutual magnetization directions of two ferromagnetic layers having an insulating layer therebetween changes. As methods for performing writing to MRAMs, a method for performing writing (magnetization reversal) using a magnetic field generated by a current and a method for performing writing (magnetization reversal) using a spin transfer torque (STT) generated when a current flows in a lamination direction in which a magnetoresistance effect element is laminated are known.

Although magnetization reversal of TMR elements using an STT is energy efficient, it is necessary to supply a current in a lamination direction in which a magnetoresistance effect element is laminated at the time of writing data. A write current may deteriorate the characteristics of magnetoresistance effect elements in some cases.

Thus, in recent years, as a method for enabling magnetization rotation without flowing a current in a lamination direction in which a magnetoresistance effect element is laminated, attention has been focused on a spin-orbit torque magnetoresistance effect element using a spin-orbit torque (SOT) due to a pure spin current generated through spin-orbit interaction (for example, Patent Document 1). An SOT is induced due to a pure spin current generated through spin-orbit interaction or a Rashba effect at an interface between different materials. A current for inducing an SOT in the magnetoresistance effect element flows in a direction crossing a lamination direction in which the magnetoresistance effect element is laminated. That is to say, the spin-orbit torque magnetoresistance effect element does not require a current to flow in the lamination direction in which the magnetoresistance effect element is laminated, and an increase in lifespan of the magnetoresistance effect element is expected.

PRIOR ART DOCUMENTS

Patent Documents

Patent Document 1: Japanese Unexamined Patent Application, First Publication No. 2017-216286

DISCLOSURE OF INVENTION

Problems to be Solved by the Invention

In order to increase a driving efficiency of a magnetoresistance effect element, there is a need to reduce an inversion current density required for reversing magnetization using an SOT. However, it is said that an inversion current density using an SOT is substantially the same as an inversion current density using an STT.

The present invention was made in view of the above-described circumstances, and an object of the present invention is to provide a spin-orbit torque magnetoresistance effect element and a magnetic memory which have a reduced inversion current density.

Solutions for Solving the Problems

In order to achieve the above-described object, the present invention provides the following solutions.

(1) A spin-orbit torque magnetoresistance effect element according to a first aspect includes: a first ferromagnetic layer; a second ferromagnetic layer; a non-magnetic layer positioned between the first ferromagnetic layer and the second ferromagnetic layer; and a spin-orbit torque wiring on which the first ferromagnetic layer is laminated, wherein the spin-orbit torque wiring extends in a second direction crossing a first direction which is an orthogonal direction of the first ferromagnetic layer, the first ferromagnetic layer includes a first laminate structure and an interfacial magnetic layer in order from the spin-orbit torque wiring side, the first laminate structure is a structure obtained by arranging a ferromagnetic conductor layer and an oxide-containing layer in order from the spin-orbit torque wiring side, the ferromagnetic conductor layer includes a ferromagnetic metal element, and the oxide-containing layer includes an oxide of a ferromagnetic metal element.

(2) In the spin-orbit torque magnetoresistance effect element according to the aspect, the ferromagnetic metal element of the oxide included in the oxide-containing layer may be the same as the ferromagnetic metal element included in the ferromagnetic conductor layer.

(3) In the spin-orbit torque magnetoresistance effect element according to the aspect, at least one second laminate structure in which a ferromagnetic conductor layer and an oxide-containing layer are laminated may be inserted between the first laminate structure and the interfacial magnetic layer.

(4) In the spin-orbit torque magnetoresistance effect element according to the aspect, a film thickness of the ferromagnetic conductor layer in the first laminate structure may be larger than a film thickness of the ferromagnetic conductor layer in the second laminate structure.

(5) In the spin-orbit torque magnetoresistance effect element according to the aspect, a film thickness of the oxide-containing layer may be 1.0 nm or less.

(6) In the spin-orbit torque magnetoresistance effect element according to the aspect, the oxide contained in the oxide-containing layer may contain insufficient oxygen with respect to a stoichiometric composition.

(7) In the spin-orbit torque magnetoresistance effect element according to the aspect, the first ferromagnetic layer may include a diffusion prevention layer and the diffusion prevention layer may be positioned on a surface of the interfacial magnetic layer on a side thereof opposite to a side thereof in contact with the non-magnetic layer.

(8) In the spin-orbit torque magnetoresistance effect element according to the aspect, the interfacial magnetic layer may include at least one element selected from the group consisting of Co, Fe, and B.

(9) A magnetic memory according to a second aspect includes: a plurality of the spin-orbit torque magnetoresistance effect elements according to any one of the aspects.

Effects of Invention

According to the present invention, it is possible to provide a spin-orbit torque magnetoresistance effect element and a magnetic memory which have a reduced inversion current density.

EMBODIMENTS FOR CARRYING OUT THE INVENTION

Figure 1:
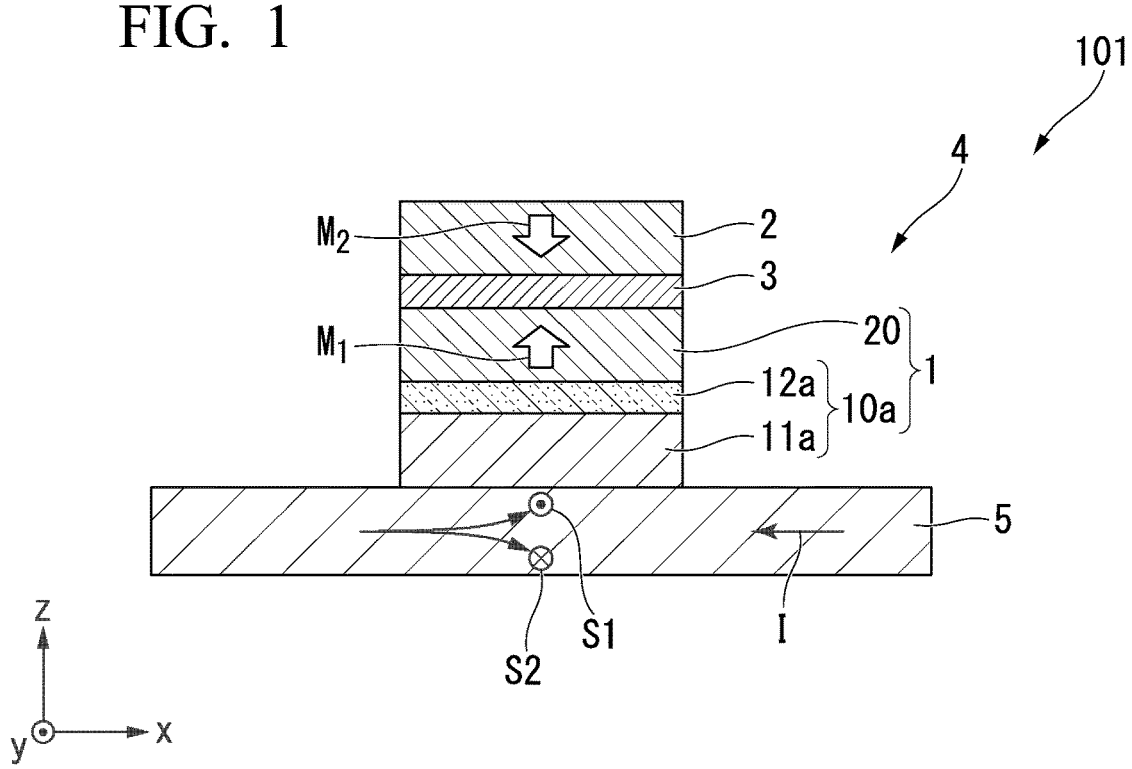
FIG. 1 is a schematic cross-sectional view of an example of a spin-orbit torque magnetoresistance effect element according to a first embodiment.

An embodiment will be described in detail below with reference to the drawings as appropriate. In the drawings used in the following description, in order to facilitate understanding of the features of the embodiment, for the sake of convenience, enlarged characteristic portions are illustrated in some cases and dimensional ratios between the constituent elements and the like may be different from the actual dimensional ratios in some cases. The materials, dimensions, and the like exemplified in the following description are mere examples and the embodiment is not limited thereto and the embodiment can be implemented through appropriate modifications within the ranges where the effects of the present invention are obtained.

First Embodiment (Spin-Orbit Torque Magnetoresistance Effect Element)

FIG. 1 is a schematic cross-sectional view of an example of a spin-orbit torque magnetoresistance effect element according to a first embodiment. FIG. 1 illustrates a cross section of the spin-orbit torque magnetoresistance effect element cut along an xz plane passing through a center of a spin-orbit torque wiring 5 in a y direction thereof. A spin-orbit torque magnetoresistance effect element 101 illustrated in FIG. 1 includes a functional unit 4 and the spin-orbit torque wiring 5. The functional unit 4 includes a first ferromagnetic layer 1, a second ferromagnetic layer 2, and a non-magnetic layer 3. The non-magnetic layer 3 is positioned between the first ferromagnetic layer 1 and the second ferromagnetic layer 2. The spin-orbit torque wiring 5 extends in a second direction crossing a first direction which is an orthogonal direction of the first ferromagnetic layer 1. The first ferromagnetic layer 1 is laminated on the spin-orbit torque wiring 5.

Hereinafter, the first direction which is the orthogonal direction of the first ferromagnetic layer 1 (the direction orthogonal (normal) to a surface (plane) of the first ferromagnetic layer 1) is assumed to be a z direction, a second direction which is orthogonal to the first direction and in which the spin-orbit torque wiring 5 extends is assumed to be an x direction, and a direction orthogonal to both of the x direction and the z direction is assumed to be a y direction.

[Functional Unit]

The functional unit 4 functions in the same manner as a normal magnetoresistance effect element. In the cased where the non-magnetic layer 3 consists of an insulator, the functional unit 4 has the same constitution as a tunneling magnetoresi stance effect (TMR: tunneling magnetoresi stance) element. Furthermore, in the case where the non-magnetic layer 3 consists of a metal, the functional unit 4 has the same constitution as a giant magnetoresistance effect (GMR: giant magnetoresistance) element. The second ferromagnetic layer 2 is referred to as a fixed layer or a reference layer and the first ferromagnetic layer 1 is referred to as a free layer, a storage layer, or the like.

The functional unit 4 functions when a magnetization of the second ferromagnetic layer 2 is fixed in one direction (the z direction) and a magnetization direction of the first ferromagnetic layer 1 relatively changes. A coercivity of the second ferromagnetic layer 2 is made larger than a coercivity of the first ferromagnetic layer 1 in the case where it is applied to a coercivity-differed type (pseudo spin valve type) MRAM. The magnetization of the second ferromagnetic layer 2 is fixed through exchange coupling with an antiferromagnetic layer in the case where it is applied to an exchange bias type (spin valve type) MRAM.

The functional unit 4 may include a layer other than the first ferromagnetic layer 1, the second ferromagnetic layer 2, and the non-magnetic layer 3. For example, an antiferromagnetic layer configured to fix a magnetization direction of the second ferromagnetic layer 2, an underlayer configured to improve the crystallinity of the functional unit 4, and the like may be exemplified.

(First Ferromagnetic Layer)

The first ferromagnetic layer 1 includes a first laminate structure 10a and an interfacial magnetic layer 20. The first ferromagnetic layer 1 is configured so that a magnetization direction of the interfacial magnetic layer 20 can be changed. The first laminate structure 10a is a structure in which a ferromagnetic conductor layer 11a and an oxide-containing layer 12a are laminated. The interfacial magnetic layer 20 is in contact with the non-magnetic layer 3 and the ferromagnetic conductor layer 11a is in contact with the spin-orbit torque wiring 5.

"Ferromagnetic Conductor Layer"

The ferromagnetic conductor layer 11a contains a ferromagnetic metal element. It is desirable that the ferromagnetic conductor layer 11a have conductivity higher than that of the spin-orbit torque wiring 5. By increasing the conductivity of the ferromagnetic conductor layer 11a, electrons flowing through the spin-orbit torque wiring 5 can easily enter the ferromagnetic conductor layer 11a. Furthermore, the ferromagnetic conductor layer 11a loses its symmetry in crystal structure due to the oxide-containing layer 12a and an internal field (a distribution in which electrons are present) of the ferromagnetic conductor layer 11a changes. If electrons enter the ferromagnetic conductor layer 11a whose internal field is changing, a spin current generated in the ferromagnetic conductor layer 11a increases as compared with a case in which the symmetry of the internal field is not broken. If the spin current generated in the ferromagnetic conductor layer 11a increases, an inversion current density of the spin-orbit torque magnetoresistance effect element 101 decreases. Furthermore, a perpendicular magnetic anisotropy (PMA) of the ferromagnetic conductor layer 11a increases if oxygen in the oxide-containing layer 12a is combined with a ferromagnetic element. In addition, if a perpendicular magnetic anisotropy (PMA) of the ferromagnetic conductor layer 11a increases, the thermal stability of the ferromagnetic conductor layer 11a improves.

It is desirable that the ferromagnetic conductor layer 11a be formed of Co, Fe, Ni, Ga, or an alloy of these metals. It is desirable that a film thickness of the ferromagnetic conductor layer 11a be in a range of 0.3 nm or more and 2.0 nm or less.

"Oxide-Containing Layer"

The oxide-containing layer 12a includes an oxide of a ferromagnetic metal element. A constitution of the oxide-containing layer 12a is not particularly limited as long as the oxide-containing layer 12a is formed to break the symmetry of a crystal structure of the ferromagnetic conductor layer 11a. The symmetry of the crystal structure of the ferromagnetic conductor layer 11a is broken, for example, due to an amount of oxygen vacancies in the oxide-containing layer 12a which is non-uniform depending on a location in an in-plane direction (in an xy plane). Furthermore, in the case where the amount of oxygen vacancies in the oxide-containing layer 12a is made non-uniform in an orthogonal direction (in an xz direction or a yz direction) orthogonal to the in-plane direction (an xy-in-plane), it is also possible to break the symmetry of the crystal structure of the ferromagnetic conductor layer 11a. In addition, an amount of oxygen in an in-plane direction or in an orthogonal direction may be made non-uniform by making a part of the oxide-containing layer 12a have an excessive oxygen state; and thereby, the symmetry of the crystal structure may be broken. The oxide-containing layer 12a may be, for example, a layer composed of an oxide or a layer including a ferromagnetic metal element and an oxide. A layer including a ferromagnetic metal element and an oxide may have a structure in which the oxide is scattered in the ferromagnetic metal element in an island shape or a structure in which particles of the oxide are dispersed in the ferromagnetic metal element.

It is desirable that a ferromagnetic metal element contained in an oxide of the oxide-containing layer 12a be the same as a ferromagnetic metal element contained in the ferromagnetic conductor layer 11a. In this case, the adhesion between the oxide-containing layer 12a and the ferromagnetic conductor layer 11a improves and the symmetry of the crystal structure of the ferromagnetic conductor layer 11a is easily broken. If the symmetry of the crystal structure of the ferromagnetic conductor layer 11a is broken, the generation efficiency of a spin current in the ferromagnetic conductor layer 11a improves.

It is desirable that the oxide of the ferromagnetic metal element contained in the oxide-containing layer 12a contain insufficient oxygen with respect to a stoichiometric composition. In this case, electrons trapped by oxygen function as carriers so that a spin current supplied from the ferromagnetic conductor layer 11a easily passes through the oxide-containing layer 12a. Thus, the transmission efficiency of the spin current towards the interfacial magnetic layer 20 improves. It is desirable that the oxide of the ferromagnetic metal element be deficient in oxygen in a range of 5 atomic % or more and 30 atomic % or less with respect to a stoichiometric composition.

A film thickness of the oxide-containing layer 12a is preferably 1.0 nm or less. In this case, the ferromagnetic conductor layer 11a and the interfacial magnetic layer 20 are more strongly ferromagnetically coupled; and thereby, the stability of magnetization against thermal disturbance and the like increases. Furthermore, if the oxide-containing layer 12a has a small film thickness, oxygen is scattered and the symmetry of the crystal structure of the ferromagnetic conductor layer 11a is easily broken. For this reason, it is desirable that the film thickness of the oxide-containing layer 12a be equal to or more than a film thickness corresponding to one atomic layer. In the case where the film thickness is a film thickness corresponding to one atomic layer, a continuous and uniform layer is not formed and an oxide is scattered. However, in this case, the layer is also handled as an oxide-containing layer.

"Interfacial Magnetic Layer"

A ferromagnetic material, particularly, a soft magnetic material can be applied to the interfacial magnetic layer 20.

The interfacial magnetic layer 20 includes, for example, a metal selected from the group consisting of Cr, Mn, Co, Fe, and Ni, an alloy containing at least one of these metals, an alloy containing at least one of these metals and at least one element of B, C, and N, or the like. The interfacial magnetic layer 20 is, for example, Co—Fe, Co—Fe—B, or Ni—Fe. Furthermore, in the case where the interfacial magnetic layer 20 is an in-plane magnetic film, the interfacial magnetic layer 20 is, for example, a Co—Ho alloy (CoHo$_2$), an Sm—Fe alloy (SmFe$_{12}$), or the like.

The interfacial magnetic layer 20 may be a Heusler alloy such as Co$_2$FeSi or the like. The Heusler alloy includes an intermetallic compound having a chemical composition of XYZ or X$_2$YZ. X represents a Co-, Fe-, Ni-, or Cu-group transition metal element or a noble metal element in the periodic table, Y represents a Mn-, V-, Cr-, or Ti-group transition metal in the periodic table or the element represented by X, and Z represents a typical element from Group III to Group V in the periodic table. Examples of the Heusler alloy include Co$_2$FeSi, Co$_2$FeGe, Co$_2$FeGa, Co$_2$MnSi, Co$_2$Mn$_{1-a}$Fe$_a$Al$_b$Si$_{1-b}$, Co$_2$FeGe$_{1-c}$Ga$_c$, and the like. The Heusler alloy has a high spin polarization and can increase an MR ratio of the functional unit 4.

It is desirable that the interfacial magnetic layer 20 include at least one element selected from the group consisting of Co, Fe, and B. It is particularly desirable that the interfacial magnetic layer 20 be Co—Fe—B. In this case, it is possible to increase the MR ratio of the functional unit 4.

It is desirable that a film thickness of the interfacial magnetic layer 20 be in a range of 0.5 nm or more and 3.0 nm or less.

(Non-Magnetic Layer)

Known materials can be used for the non-magnetic layer 3.

For example, in the case where the non-magnetic layer 3 consists of an insulator (in the case where the non-magnetic layer 3 is a tunnel barrier layer), the non-magnetic layer 3 is, for example, $Al_2O_3$, $SiO_2$, MgO, $MgAl_2O_4$, or the like. Furthermore, the non-magnetic layer 3 may be a non-magnetic layer in which a part of Al, Si, and Mg in these compounds is replaced with Zn, Be, or the like. Among them, MgO and $MgAl_2O_4$ are materials in which a coherent tunneling can be realized. Thus, it is possible to increase the MR ratio of the functional unit 4. In the case where the non-magnetic layer 3 consists of a metal, the non-magnetic layer 3 is, for example, Cu, Au, Ag, or the like. In addition, in the case where the non-magnetic layer 3 consists of a semiconductor, the non-magnetic layer 3 is, for example, Si, Ge, $CuInSe_2$, $CuGaSe_2$, $Cu(In, Ga)Se_2$, or the like.

It is desirable that a film thickness of the non-magnetic layer 3 be in a range of 0.3 nm or more and 3.0 nm or less.

(Second Ferromagnetic Layer)

Known ferromagnetic materials can be used for materials of a second ferromagnetic layer 2. Examples of the ferromagnetic materials are the same as those of the interfacial magnetic layer 20. Ferromagnetic materials that are the same as those of the interfacial magnetic layer 20 or ferromagnetic materials that are different from those of the interfacial magnetic layer 20 may be used for the second ferromagnetic layer 2.

It is desirable that a film thickness of the second ferromagnetic layer 2 be in a range of 0.5 nm or more and 5.0 nm or less.

[Spin-Orbit Torque Wiring]

A spin-orbit torque wiring 5 extends in the x direction. The spin-orbit torque wiring 5 is positioned on one surface of a ferromagnetic conductor layer 11a. The spin-orbit torque wiring 5 may be directly connected to the ferromagnetic conductor layer 11a or may be connected to the ferromagnetic conductor layer 11a with another layer interposed therebetween.

The spin-orbit torque wiring 5 generates a spin current due to a spin Hall effect when a current flows therethrough. The spin Hall effect is a phenomenon in which a spin current is induced in a direction orthogonal to a direction of a current on the basis of spin-orbit interaction when the current is flowed through a wiring. A mechanism by which a spin current is generated due to the spin Hall effect will be described.

As illustrated in FIG. 1, when a potential difference is applied to both ends of the spin-orbit torque wiring 5 in the x direction, a current I flows in the x direction. When the current I flows, a first spin Si oriented in a +y direction and a second spin S2 oriented in a −y direction are each bent in a direction orthogonal to the current. A normal Hall effect and the spin Hall effect are the same in that a movement (traveling) direction of moving (traveling) charges (electrons) is bent. On the other hand, the normal Hall effect and the spin Hall effect greatly differ in that, in the normal Hall effect, charged particles moving in a magnetic field are subjected to a Lorentz force and a moving direction of the charged particles is bent, whereas in the spin Hall effect, a moving direction of charged particles is bent only due to moving electrons (only due to a flowing current) even though a magnetic field is absent. In order to eliminate an uneven distribution state of the first spin S1 and the second spin S2 caused due to the spin Hall effect, a spin current is generated in the z direction.

Since the number of electrons of the first spin S1 is equal to the number of electrons of the second spin S2 in a non-magnetic material (a material that is not a ferromagnetic material), the number of electrons of the first spin Si directed upward is equal to the number of electrons of the second spin S2 directed downward in the drawings. For this reason, a current corresponding to a net flow of charges is zero. A spin current without such a current is particularly referred to as a pure spin current.

Here, when a flow of electrons of the first spin S1 is represented by $J_\uparrow$, a flow of electrons of the second spin S2 is represented by $J_\downarrow$, and a spin current is represented by $J_S$, they are defined by $J_S = J_\uparrow - J_\downarrow$. The spin current $J_S$ flows in the z direction in the drawings. In FIG. 1, the first ferromagnetic layer 1 is present on an upper surface of the spin-orbit torque wiring 5. For this reason, spins are injected into the first ferromagnetic layer 1.

The spin-orbit torque wiring 5 is constituted by (formed of) any of metals, alloys, intermetallic compounds, metal borides, metal carbides, metal silicides, and metal phosphides which have a function of generating a spin current using a spin Hall effect when a current flows.

It is desirable that a main component of the spin-orbit torque wiring 5 be a non-magnetic heavy metal. The heavy metal refers to a metal having a specific gravity equal to or higher than that of yttrium. It is desirable that the non-magnetic heavy metal be a non-magnetic metal having a large atomic number which is an atomic number of 39 or more and having d electrons or f electrons in the outermost shell. These non-magnetic metals have a large spin-orbit interaction which causes a spin Hall effect.

Electrons generally move in a direction opposite to that of a current regardless of orientation of their spins. On the other hand, a non-magnetic metal having a large atomic number with d electrons or f electrons in the outermost shell has a large spin-orbit interaction, and a spin Hall effect strongly acts therewith. For this reason, a direction in which electrons move depends on an orientation of spins of the electrons. Therefore, in these non-magnetic heavy metals, a spin current $J_S$ is easily generated.

Also, the spin-orbit torque wiring 5 may include a magnetic metal. The magnetic metal refers to a ferromagnetic metal or an antiferromagnetic metal. In the case where a small amount of magnetic metal is contained in a non-magnetic metal, the small amount of magnetic metal serves as a scattering factor of spins. When spins scatter, spin-orbit interaction is enhanced and the efficiency of generating a spin current with respect to a current increases.

On the other hand, in the case where an added amount of the magnetic metal is excessively increased, a generated spin current may scatter due to the added magnetic metal, and as a result, the action of reducing a spin current may increase in some cases. For this reason, it is desirable that a molar ratio of an added magnetic metal be sufficiently smaller than the total molar ratio of elements constituting a spin-orbit torque wiring. The molar ratio of the added magnetic metal is preferably 3% or less with respect to the total molar ratio.

The spin-orbit torque wiring 5 may include a topological insulator. The topological insulator is a material in which the interior of the material is an insulator or a high resistance body and a spin-polarized metal state is generated on its surface. An internal magnetic field is generated in this material due to the spin-orbit interaction. Thus, in the topological insulator, a new topological phase develops due to the effect of the spin-orbit interaction even in the case where there is no external magnetic field. The topological insulator can generate a pure spin current with high efficiency due to a strong spin-orbit interaction and breaking of inversion symmetry at an edge.

Preferred examples of the topological insulators include SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. These topological insulators can generate a spin current with high efficiency.

(Method for Producing Spin-Orbit Torque Magnetoresistance Effect Element)

The spin-orbit torque magnetoresistance effect element 101 can be produced, for example, by laminating the ferromagnetic conductor layer 11a, the oxide-containing layer 12a, the interfacial magnetic layer 20, the non-magnetic layer 3, and the second ferromagnetic layer 2 in this order from the spin-orbit torque wiring 5 side. As a method for laminating the ferromagnetic conductor layer 11a, the interfacial magnetic layer 20, the non-magnetic layer 3, and the second ferromagnetic layer 2, known methods such as a sputtering method, a chemical vapor deposition (CVD) method, or the like can be used. As a method for laminating the oxide-containing layer 12a, for example, a method for forming a ferromagnetic metal film using a sputtering method or a CDV method and then oxidizing the obtained ferromagnetic metal film, or a method for co-sputtering a ferromagnetic metal and an oxide can be used.

It is desirable that the obtained laminate be subjected to an annealing treatment. By performing the annealing treatment, it is possible to improve the crystallinity of each of the layers and increase the MR ratio of the functional unit 4.

It is desirable that the annealing treatment be performed by: heating at a temperature of 300° C. or higher and 500° C. or lower for 5 minutes or more and 100 minutes or less in an inert atmosphere of Ar or the like; and then heating at a temperature of 100° C. or higher and 500° C. or lower for 1 hour or more and 10 hours or less in a state where a magnetic field of 2 kOe or more and 10 kOe or less is applied.

In the spin-orbit torque magnetoresistance effect element 101 in this embodiment having the above-described constitution, since a spin current is generated in the ferromagnetic conductor layer 11a, it is possible to reduce an inversion current density.

Figure 2:
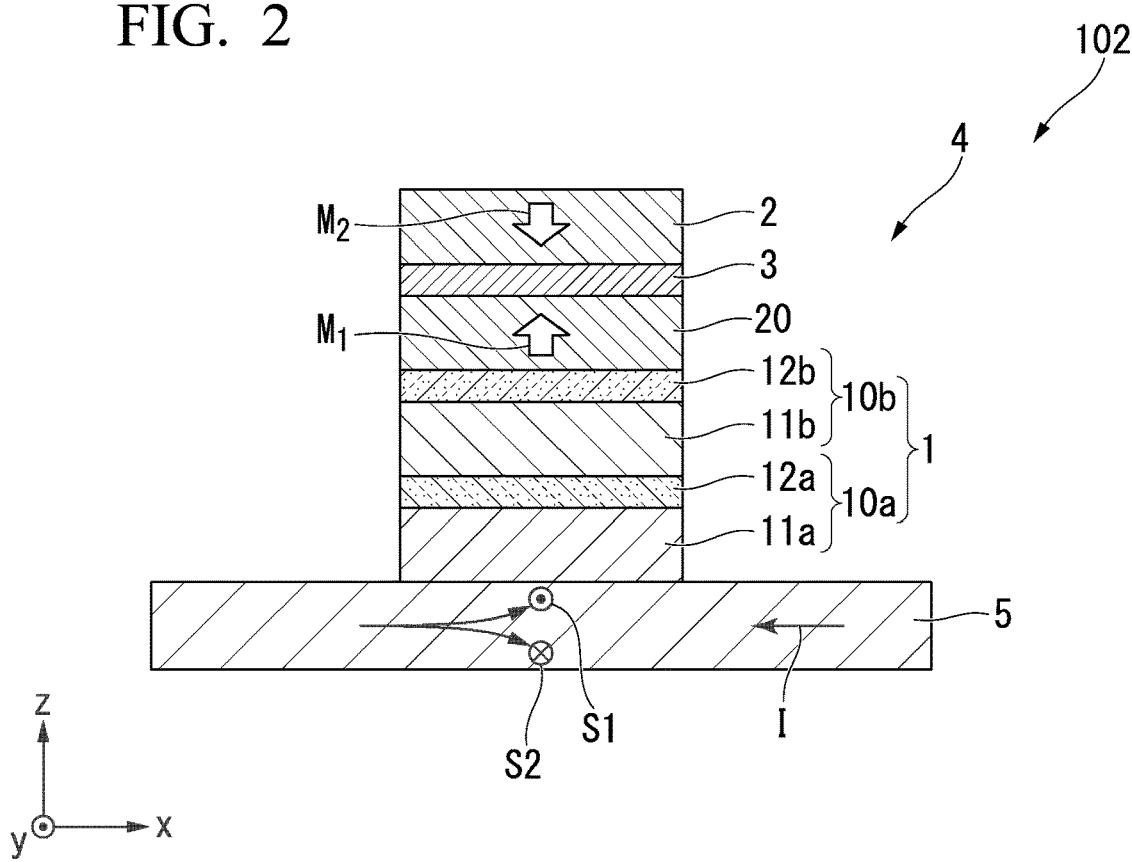
FIG. 2 is a schematic cross-sectional view of a spin-orbit torque magnetoresistance effect element according to Modification 1.

FIG. 2 is a schematic cross-sectional view of a spin-orbit torque magnetoresistance effect element according to Modification 1. FIG. 2 illustrates a cross section of the spin-orbit torque magnetoresistance effect element cut along an xz plane passing through a center of a spin-orbit torque wiring 5 in the y direction. The spin-orbit torque magnetoresistance effect element 102 illustrated in FIG. 2 is the same as the spin-orbit torque magnetoresistance effect element 101 illustrated in FIG. 1 except that a second laminate structure 10b is inserted between a first laminate structure 10a and an interfacial magnetic layer 20. For this reason, constituent elements of the spin-orbit torque magnetoresistance effect element 102 that are the same as those of the spin-orbit torque magnetoresistance effect element 101 will be denoted with reference numerals that are same as those of the spin-orbit torque magnetoresistance effect element 101 and a description thereof will be omitted.

The second laminate structure 10b is a structure obtained by laminating a ferromagnetic conductor layer 11b and an oxide-containing layer 12b. The ferromagnetic conductor layer 11b is positioned between the oxide-containing layer 12a and the oxide-containing layer 12b. The ferromagnetic conductor layer 11b is, for example, in contact with the oxide-containing layer 12a in the first laminate structure 10a. The oxide-containing layer 12b is positioned between the ferromagnetic conductor layer 11b and the interfacial magnetic layer 20. The oxide-containing layer 12b is, for example, in contact with the interfacial magnetic layer 20.

It is desirable that a film thickness of the ferromagnetic conductor layer 11b in the second laminate structure 10b be smaller than a film thickness of the ferromagnetic conductor layer 11a in the first laminate structure 10a. In the case where the film thickness of the ferromagnetic conductor layer 11a in the first laminate structure 10a in contact with the spin-orbit torque wiring 5 is made relatively thicker than that of the ferromagnetic conductor layer 11b, it is possible to make the ferromagnetic conductor layer 11a as an in-plane magnetic film. On the other hand, in the case where the film thickness of the ferromagnetic conductor layer 11b in the second laminate structure 10b separated from the spin-orbit torque wiring 5 is made relatively thinner than that of the ferromagnetic conductor layer 11a, it is possible to make the ferromagnetic conductor layer 11b as a perpendicular magnetization film. In the case where the ferromagnetic conductor layer 11a and the ferromagnetic conductor layer 11b having different magnetization orientation directions are brought close to each other in this way, it is possible to make the entire magnetization state of the first ferromagnetic layer 1 inclined with respect to the z direction. In the case where the magnetization of the first ferromagnetic layer 1 is inclined with respect to the z direction, the symmetry of the magnetization is broken and it is possible to realize magnetic-field-free magnetization reversal. It is desirable that the film thickness of the ferromagnetic conductor layer 11b in the second laminate structure 10b be in a range of 50% or more and 90% or less with respect to the film thickness of the ferromagnetic conductor layer 11a in the first laminate structure 10a.

A film thickness of the oxide-containing layer 12b in the second laminate structure 10b is preferably 1.0 nm or less as is the case with the first laminate structure 10a.

The spin-orbit torque magnetoresistance effect element 102 can be produced in the same manner as in the case of the spin-orbit torque magnetoresistance effect element 101 except that the ferromagnetic conductor layer 11b and the oxide-containing layer 12b are laminated between the oxide-containing layer 12a and the interfacial magnetic layer 20. The ferromagnetic conductor layer 11b and the oxide-containing layer 12b in the second laminate structure 10b can be laminated as in the case of the ferromagnetic conductor layer 11a and the oxide-containing layer 12a in the first laminate structure 10a.

In the spin-orbit torque magnetoresistance effect element 102 having the above-described constitution, since a spin current is generated in the ferromagnetic conductor layer 11b in the second laminate structure 10b in addition to the ferromagnetic conductor layer 11a in the first laminate structure 10a, it is possible to further reduce an inversion current density. Although one second laminate structure 10b is inserted between the first laminate structure 10a and the interfacial magnetic layer 20 in the spin-orbit torque magnetoresistance effect element 102 illustrated in FIG. 2, the number of second laminate structures 10b is not particularly limited and may be two or more. In the case where two or more second laminate structures 10b are inserted, it is desirable to increase a film thickness of a ferromagnetic conductor layer 11b on a side closer to the spin-orbit torque wiring 5.

Figure 3:
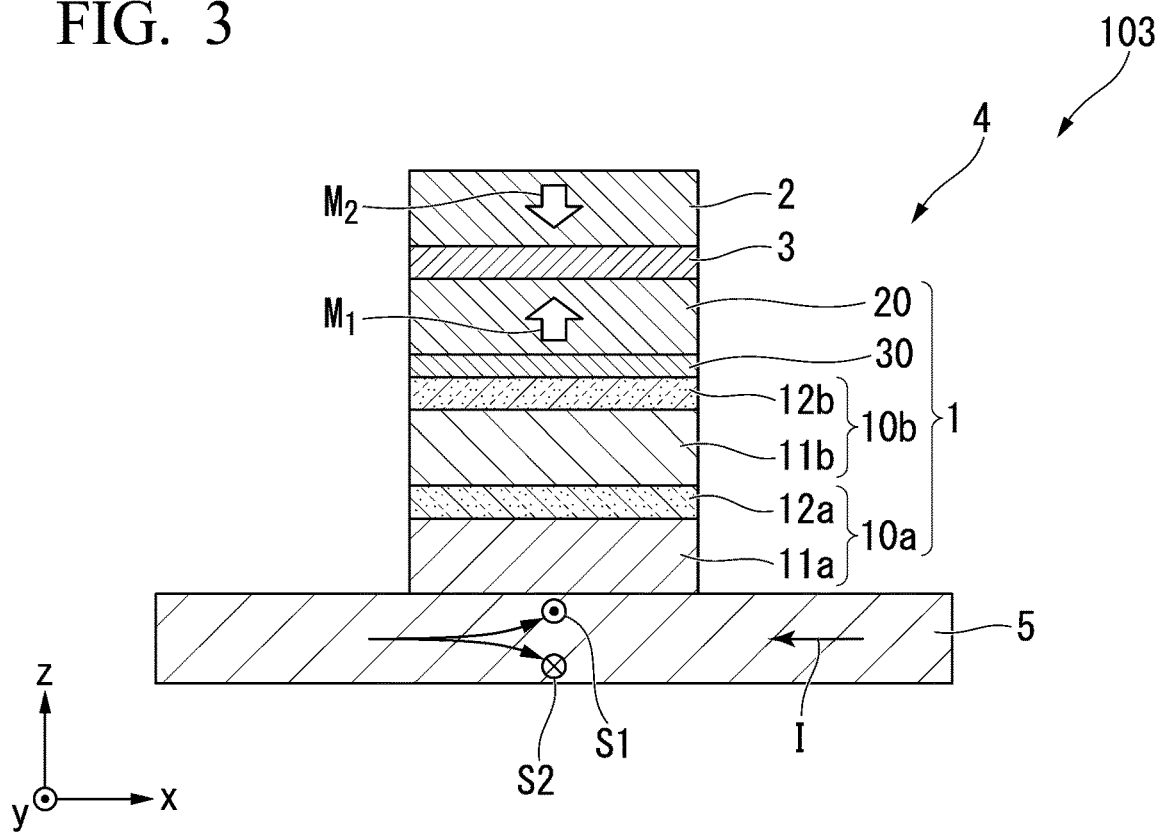
FIG. 3 is a schematic cross-sectional view of a spin-orbit torque magnetoresistance effect element according to Modification 2.

FIG. 3 is a schematic cross-sectional view of the spin-orbit torque magnetoresistance effect element according to Modification 2. FIG. 3 illustrates a cross section of the spin-orbit torque magnetoresistance effect element cut along an xz plane passing through a center of a spin-orbit torque wiring 5 in the y direction. The spin-orbit torque magnetoresistance effect element 103 illustrated in FIG. 3 is the same as the spin-orbit torque magnetoresistance effect element 102 illustrated in FIG. 2 except that the first ferromagnetic layer 1 includes a diffusion prevention layer 30. For this reason, constituent elements of the spin-orbit torque magnetoresistance effect element 103 that are the same as those of the spin-orbit torque magnetoresistance effect element 102 will be denoted with reference numerals that are the same as those of the spin-orbit torque magnetoresistance effect element 102 and a description thereof will be omitted.

The diffusion prevention layer 30 is in contact with a surface (a lower surface in FIG. 3) of the interfacial magnetic layer 20 on a side opposite to a side thereof which is in contact with the non-magnetic layer 3. The diffusion prevention layer 30 is positioned between the interfacial magnetic layer 20 and the first laminate structure 10a. For example, in a high-temperature environment such as when an annealing process is performed at the time of producing the spin-orbit torque magnetoresistance effect element 103, the diffusion prevention layer 30 prevents elements contained in the interfacial magnetic layer 20 from diffusing toward the oxide-containing layer 12b.

It is desirable that the diffusion prevention layer 30 include a non-magnetic element. Examples of the non-magnetic element include Mo, Ru, Rh, Pd, Ag, Hf, Ta, W, Re, Ir, Pt, and Au. One of these elements may be used solely or two or more thereof may be used in a combination manner. Furthermore, it is desirable that a thickness of the diffusion prevention layer 30 be at least twice a diameter of an element constituting the diffusion prevention layer. In the case where an attempt is made to form a film of a heavy metal element with such a thickness, the heavy metal element is scattered in an island shape in a precise sense. Therefore, the diffusion prevention layer 30 is a mixed layer of part of an upper layer or a lower layer and a non-magnetic element.

It is desirable that a film thickness of the diffusion prevention layer 30 be in a range of 0.3 nm or more and 2.0 nm or less.

The spin-orbit torque magnetoresistance effect element 103 can be produced in the same manner as in the case of the spin-orbit torque magnetoresistance effect element 102 except that the diffusion prevention layer 30 is laminated between the oxide-containing layer 12b and the interfacial magnetic layer 20. As a method for laminating the diffusion prevention layer 30, a known method such as a sputtering method, a chemical vapor deposition (CVD) method, or the like can be used.

In the spin-orbit torque magnetoresistance effect element 103 having the above-described constitution, since a spin current is generated in the ferromagnetic conductor layer 11a, it is possible to reduce an inversion current density. Furthermore, since the spin-orbit torque magnetoresistance effect element 103 includes the diffusion prevention layer 30, elements contained in the interfacial magnetic layer 20 do not easily diffuse into the oxide-containing layer 12b even in a high-temperature environment. For this reason, the oxide-containing layer 12b is stably present for a long period of time and the spin-orbit torque magnetoresistance effect element 103 can stably reduce an inversion current density for a long period of time.

Figure 4:
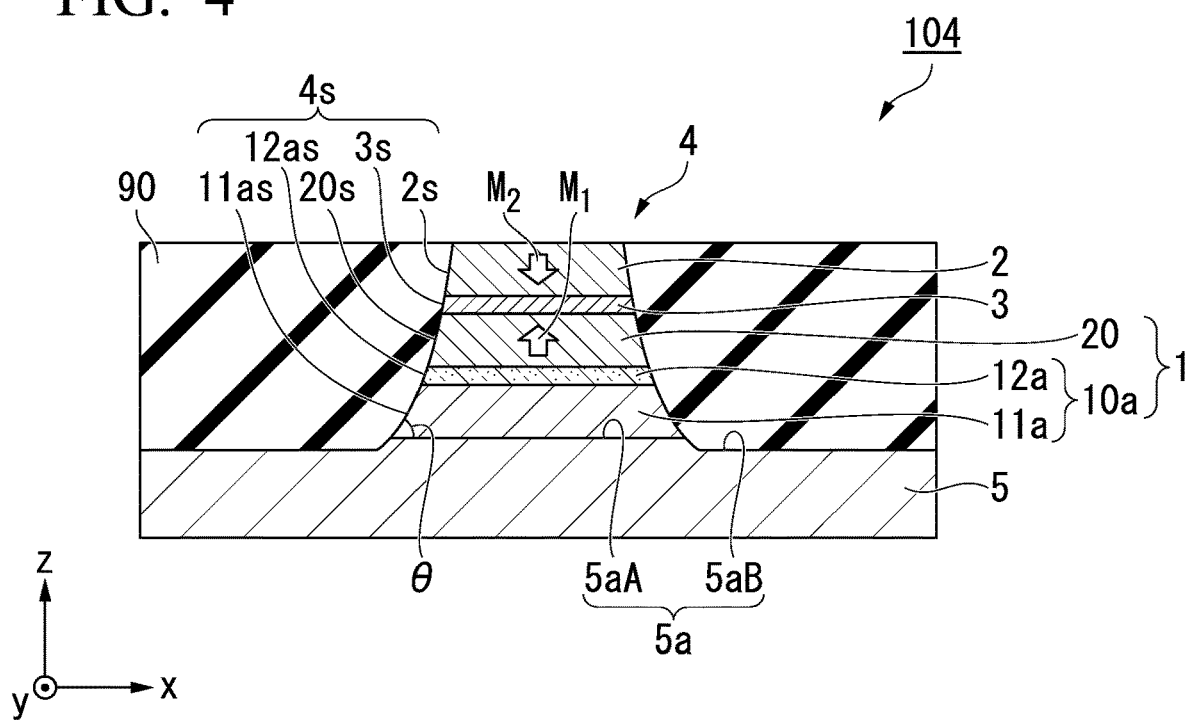
FIG. 4 is a schematic cross-sectional view of a spin-orbit torque magnetoresistance effect element according to Modification 3.
Figure 5:
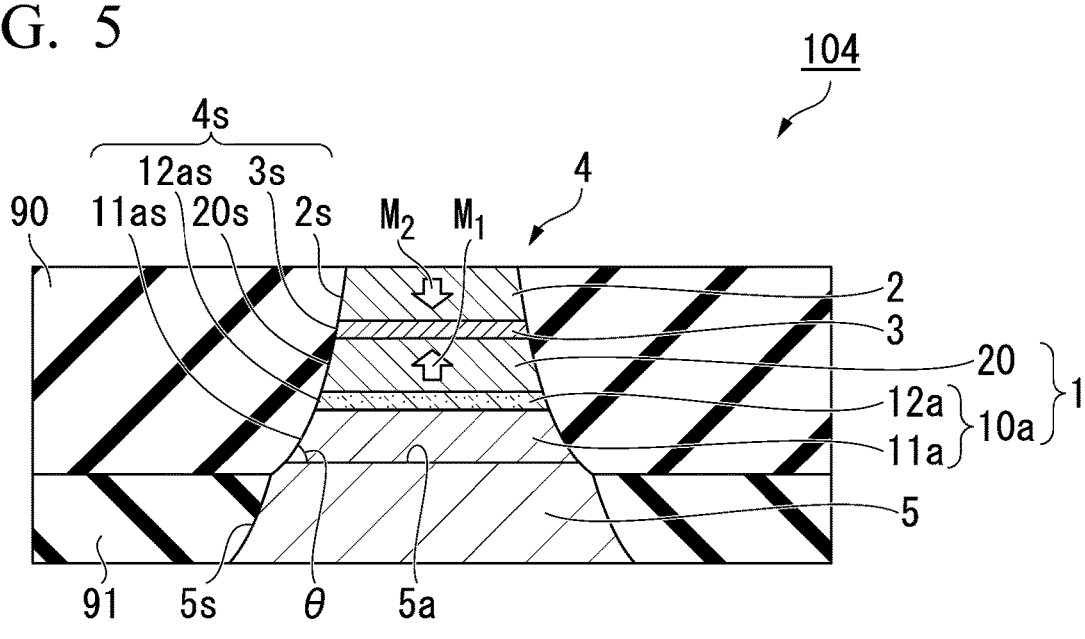
FIG. 5 is a schematic cross-sectional view of the spin-orbit torque magnetoresistance effect element according Modification 3 cut along another surface.
Figure 5:
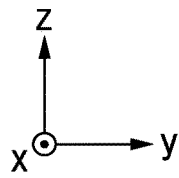

FIGS. 4 and 5 are schematic cross-sectional views of a spin-orbit torque magnetoresistance effect element 104 according to Modification 3. FIG. 4 illustrates a cross section of the spin-orbit torque magnetoresistance effect element 104 cut along an xz plane passing through a center of a spin-orbit torque wiring 5 in the y direction. FIG. 5 illustrates a cross section of the spin-orbit torque magnetoresistance effect element 104 cut along a yz plane passing through a center of a functional unit 4 in the x direction. The spin-orbit torque magnetoresistance effect element 104 illustrated in FIGS. 4 and 5 is the same as the spin-orbit torque magnetoresistance effect element 101 except that a shape of the lateral side surface of the functional unit 4 and a shape of a first surface 5a of the spin-orbit torque wiring 5 in the spin-orbit torque magnetoresistance effect element 104 are different from those in the spin-orbit torque magnetoresistance effect element 101. For this reason, constituent elements of the spin-orbit torque magnetoresistance effect element 104 that are the same as those of the spin-orbit torque magnetoresistance effect element 101 will be denoted with reference numerals that are the same as those of the spin-orbit torque magnetoresistance effect element 101 and a description thereof will be omitted.

The functional unit 4 illustrated in FIGS. 4 and 5 spreads in the xy plane as it approaches the spin-orbit torque wiring 5 when viewed from the z direction. An outer circumferential length or an outer diameter of the functional unit 4 increases at it approaches the spin-orbit torque wiring 5 when viewed from the z direction. Furthermore, the lateral side surface 4s of the functional unit 4 is inclined with respect to an xy plane when viewed from the x direction or the y direction. An inclination angle θ of the lateral side surface 4s with respect to the xy plane may be different or may be constant depending on a height position in the z direction. The inclination angle θ of the lateral side surface 4s with respect to the xy plane decreases, for example, as it approaches the spin-orbit torque wiring 5.

The lateral side surface 4s of the functional unit 4 consists of lateral side surfaces 2s, 3s, 20s, 12as, and 11as of the second ferromagnetic layer 2, the non-magnetic layer 3, the interfacial magnetic layer 20, the oxide-containing layer 12a, and the ferromagnetic conductor layer 11a. The lateral side surfaces 2s, 3s, 20s, 12as, and 11as are inclined with respect to the xy plane. The lateral side surfaces 2s, 3s, 20s, 12as, and 11as are continuous and form one lateral side surface 4s. The term "continuous" means that a slope of a tangent drawn along the lateral side surface 4s changes continuously or is constant in a cut plane cut along the xz plane or the yz plane.

A height position of the first surface 5a of the spin-orbit torque wiring 5 in the z direction differs depending on a location. The first surface 5a is a surface of the spin-orbit torque wiring 5 on a side thereof close to the functional unit 4. Hereinafter, a portion of the first surface 5a in which the first surface 5a overlaps with the functional unit 4 in the z direction is referred to as a first surface 5aA and a portion of the first surface 5a in which the first surface 5a does not overlap with the functional unit 4 in the z direction is referred to as a first surface 5aB. The first surface 5aA is positioned further in a +z direction than the first surface 5aB. That is to say, the first surface 5aA is positioned farther from a substrate Sub which will be described later than the first surface 5aB. The first surface 5aB may be formed to be positioned farther in a −z direction than the first surface 5aA by using ion milling or the like when the functional unit 4 is processed into a predetermined shape in some cases.

As illustrated in FIG. 5, the lateral side surface 5s of the spin-orbit torque wiring 5 is inclined with respect to the xy plane. The lateral side surface 5s and the lateral side surface 4s are, for example, discontinuous. The term "discontinuous" means that a slope of a tangent drawn along the lateral side surfaces 5s and 4s does not change continuously in a cut plane cut along the xz plane or the yz plane. In the case where the spin-orbit torque wiring 5 is processed into a predetermined shape and then the functional unit 4 is processed into a predetermined shape, the lateral side surface 5s and the lateral side surface 4s may be discontinuous in some cases.

In FIGS. 4 and 5, insulating layers 90 and 91 configured to surround the functional unit 4 and the spin-orbit torque wiring 5 are also illustrated. The insulating layers 90 and 91 are insulating layers configured to insulate between wirings of a multilayer wiring and between elements. The insulating layers 90 and 91 are, for example, a silicon oxide ($SiO_x$), a silicon nitride ($SiN_x$), a silicon carbide (SiC), chromium nitride, a silicon carbonitride (SiCN), a silicon oxynitride (SiON), an aluminum oxide ($Al_2O_3$), a zirconium oxide ($ZrO_x$), or the like.

In the spin-orbit torque magnetoresistance effect element 104 having the above-described constitution, since a spin current is generated in the ferromagnetic conductor layer 11a, it is possible to reduce an inversion current density. Furthermore, since the lateral side surface 11as of the ferromagnetic conductor layer 11a is inclined with respect to the xy plane, a current from the spin-orbit torque wiring 5 to the ferromagnetic conductor layer 11a smoothly flows. That is to say, the spin-orbit torque magnetoresistance effect element 104 can minimize a current loss accompanied by a rapid change in current density.

Figure 6:
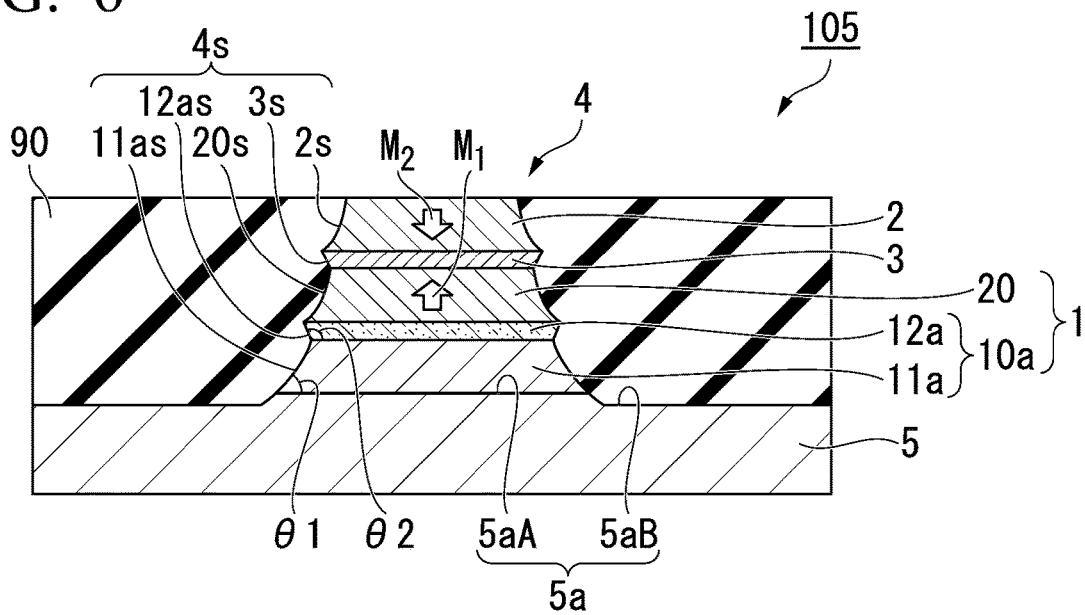
FIG. 6 is a schematic cross-sectional view of a spin-orbit torque magnetoresistance effect element according to Modification 4.
Figure 6:
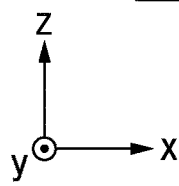

FIG. 6 is a schematic cross-sectional view of a spin-orbit torque magnetoresistance effect element 105 according to Modification 4. FIG. 6 illustrates a cross section of the spin-orbit torque magnetoresistance effect element 105 cut along an xz plane passing through a center of a spin-orbit torque wiring 5 in the y direction. The spin-orbit torque magnetoresistance effect element 105 illustrated in FIG. 6 is the same as the spin-orbit torque magnetoresistance effect element 104 according to Modification 3 except that a shape of a lateral side surface of a functional unit 4 in the spin-orbit torque magnetoresistance effect element 105 is different from that in the spin-orbit torque magnetoresistance effect element 104. For this reason, constituent elements of the spin-orbit torque magnetoresistance effect element 105 that are the same as those of the spin-orbit torque magnetoresistance effect element 104 will be denoted with reference numerals that are the same as those of the spin-orbit torque magnetoresistance effect element 104 and a description thereof will be omitted.

The functional unit 4 illustrated in FIG. 6 gradually spreads in the xy plane as it approaches the spin-orbit torque wiring 5 when viewed from the z direction. Outer circumferential lengths or outer diameters of a second ferromagnetic layer 2, an interfacial magnetic layer 20, and a ferromagnetic conductor layer 11a consisting of metals in the functional unit 4 illustrated in FIG. 6 increase as they approach the spin-orbit torque wiring 5. Outer circumferential lengths or outer diameters of a non-magnetic layer 3 and an oxide-containing layer 12a consisting of materials other than metals in the functional unit 4 illustrated in FIG. 6 decrease as they approach the spin-orbit torque wiring 5.

The lateral side surfaces 2s, 20s, and 11as of the second ferromagnetic layer 2, the interfacial magnetic layer 20, and the ferromagnetic conductor layer 11a are inclined, for example, at an inclination angle θ1 with respect to the xy plane. The lateral side surfaces 3s and 12as of the non-magnetic layer 3 and the oxide-containing layer 12a are inclined, for example, at an inclination angle θ2 with respect to the xy plane. The inclination angles θ1 and θ2 may be different or constant depending on height positions in the z direction. The inclination angle θ1 is different from the inclination angle θ2. The inclination angle θ1 is, for example, less than 90° and the inclination angle θ2 is, for example, 90° or more.

The lateral side surface 4s of the functional unit 4 is discontinuous. The lateral side surface 4s is discontinuous at boundaries between the lateral side surfaces 2s, 3s, 20s, 12as, and 11as of the layers. The lateral side surface 4s has, for example, steps at a boundary between the second ferromagnetic layer 2 and the non-magnetic layer 3, a boundary between the non-magnetic layer 3 and the interfacial magnetic layer 20, a boundary between the interfacial magnetic layer 20 and the oxide-containing layer 12a, and a boundary between the oxide-containing layer 12a and the ferromagnetic conductor layer 11a.

When the functional unit 4 is formed, processing is performed through a mask from the z direction, and then ion milling (side milling) or the like is performed in the x direction or the y direction in some cases. In the case where the side milling is performed, it is possible to reduce widths of the functional unit 4 in the x direction and the y direction and reduce a size of the functional unit 4. Degrees of progress of the side milling change depending on a material constituting a layer. Metals may be softer than non-metals in many cases and side milling may proceed more in a metal than in a non-metal in some cases. The lateral side surface 4s of the functional unit 4 is discontinuous due to differences between degrees of progress of side milling performed on the layers.

In the spin-orbit torque magnetoresistance effect element 105 having the above-described constitution, since a spin current is generated in the ferromagnetic conductor layer 11a, it is possible to reduce an inversion current density. Furthermore, since the lateral side surface 11as of the ferromagnetic conductor layer 11a is inclined with respect to the xy plane, a current from the spin-orbit torque wiring 5 to the ferromagnetic conductor layer 11a smoothly flows. In addition, since the lateral side surface 4s is discontinuous, it is possible to improve the adhesion between the lateral side surface 4s and the insulating layer 90.

Figure 7:
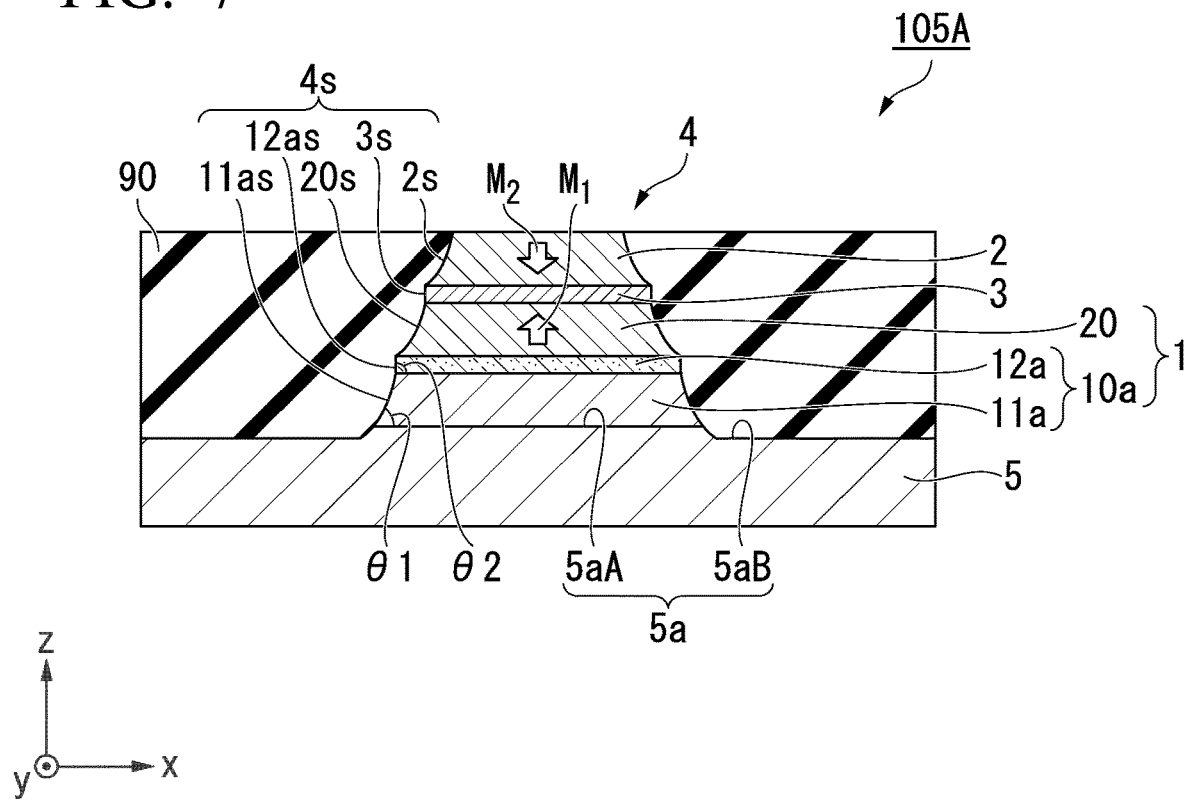
FIG. 7 is a schematic cross-sectional view of another example of the spin-orbit torque magnetoresistance effect element according to Modification 4.

FIG. 7 is a schematic cross-sectional view of another example of the spin-orbit torque magnetoresistance effect element according to Modification 4. FIG. 7 illustrates a cross section of a spin-orbit torque magnetoresistance effect element 105A cut along an xz plane passing through a center of a spin-orbit torque wiring 5 in the y direction. A case in which an inclination angle θ2 of the spin-orbit torque magnetoresistance effect element 105A is 90° is exemplified.

Figure 8:
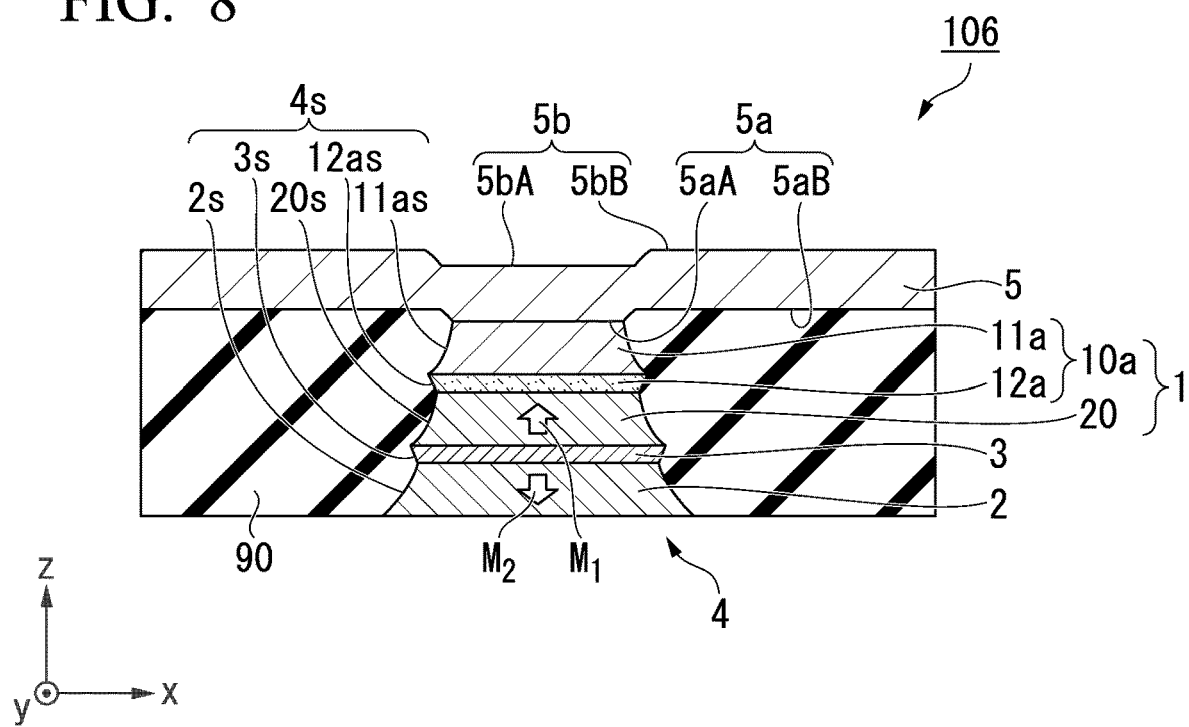
FIG. 8 is a schematic cross-sectional view of another example of a spin-orbit torque magnetoresistance effect element according to Modification 5.

FIG. 8 is a schematic cross-sectional view of a spin-orbit torque magnetoresistance effect element 106 according to Modification 5. FIG. 8 illustrates a cross section of the spin-orbit torque magnetoresistance effect element 106 cut along an xz plane passing through a center of a spin-orbit torque wiring 5 in the y direction. The spin-orbit torque magnetoresistance effect element 106 illustrated in FIG. 8 is the same as the spin-orbit torque magnetoresistance effect element 105 illustrated in FIG. 6 except that a positional relationship between a functional unit 4 and a spin-orbit torque wiring 5 in the spin-orbit torque magnetoresistance effect element 106 is different from that in the spin-orbit torque magnetoresistance effect element 105. For this reason, constituent elements of the spin-orbit torque magnetoresistance effect element 106 that are same as those of the spin-orbit torque magnetoresistance effect element 105 will be denoted with reference numerals that are the same as those of the spin-orbit torque magnetoresistance effect element 105 and a description thereof will be omitted.

In the spin-orbit torque magnetoresistance effect element 106, the spin-orbit torque wiring 5 is positioned in the +z direction with respect to the functional unit 4. That is to say, the spin-orbit torque wiring 5 is positioned farther from a substrate Sub which will be described later than the functional unit 4.

The functional unit 4 includes a second ferromagnetic layer 2, a non-magnetic layer 3, an interfacial magnetic layer 20, an oxide-containing layer 12a, and a ferromagnetic conductor layer 11a in order towards the +z direction. The second ferromagnetic layer 2 is positioned closer to the substrate Sub which will be described later than a first ferromagnetic layer 1. The functional unit 4 may be referred to as a bottom pin structure in some cases.

The spin-orbit torque wiring 5 is laminated at a position in the +z direction of the functional unit 4 and the insulating layer 90. Height positions of a first surface 5a and a second surface 5b of the spin-orbit torque wiring 5 in the z direction differ depending on locations. The first surface 5a is a surface of the spin-orbit torque wiring 5 close to the functional unit 4 and the second surface 5b is a surface of the spin-orbit torque wiring 5 opposite to the first surface 5a. Hereinafter, a portion of the first surface 5a in which the first surface 5a overlaps with the functional unit 4 in the z direction is referred to as a first surface 5aA and a portion of the first surface 5a in which the first surface 5a does not overlap with the functional unit 4 in the z direction is referred to as a first surface 5aB. Hereinafter, a portion of the second surface 5b in which the second surface 5b overlaps with the functional unit 4 in the z direction is referred to as a second surface 5bA and a portion of the second surface 5b in which the second surface 5b does not overlap with the functional unit 4 in the z direction is referred to as a second surface 5bB. The first surface 5aB is positioned farther in the +z direction than the first surface 5aA. The first surface 5aA is concave in the z direction with respect to the first surface 5aB due to a difference in polishing speed when the first surface 5a is subjected to, for example, chemical mechanical polishing (CMP). The second surface 5bB is positioned farther in the +z direction than the second surface 5bA. The second surface 5b has a shape of the first surface 5a reflected therein.

In the spin-orbit torque magnetoresistance effect element 106 having the above-described constitution, since a spin current is generated in the ferromagnetic conductor layer 11a even though the spin-orbit torque magnetoresistance effect element 106 has a bottom pin structure, it is possible to reduce an inversion current density.

Second Embodiment (Magnetic Memory)

Figure 9:
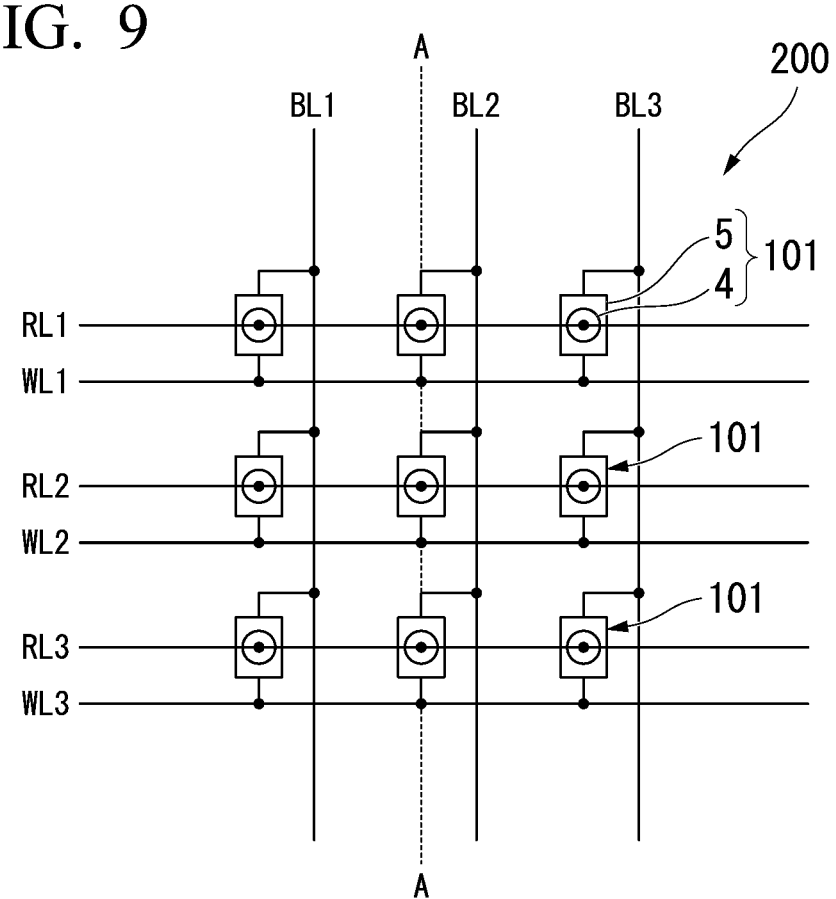
FIG. 9 is a diagram schematically illustrating a magnetic memory according to a second embodiment.

FIG. 9 is a schematic diagram of a magnetic memory 200. The magnetic memory 200 includes a plurality of the spin-orbit torque magnetoresistance effect elements 101 of the first embodiment (refer to FIG. 1). FIG. 1 corresponds to a cross-sectional view of the spin-orbit torque magnetoresistance effect elements 101 cut along surface A-A in FIG. 9. The magnetic memory 200 illustrated in FIG. 9 includes the spin-orbit torque magnetoresistance effect elements 101 arranged in a 3×3 matrix. FIG. 9 is an example of a magnetic memory and a constitution of the spin-orbit torque magnetoresistance effect elements 101, the number of the spin-orbit torque magnetoresistance effect elements 101, and an arrangement of the spin-orbit torque magnetoresistance effect elements 101 are arbitrary.

One of word lines WL1 to WL3, one of bit lines BL1 to BL3, and one of read lines RL1 to RL3 are connected to each of the spin-orbit torque magnetoresistance effect elements 101.

When a predetermined value or more of a voltage difference is applied between one of the word lines WL1 to WL3 and one of the bit lines BL1 to BL3, a current flows through a spin-orbit torque wiring 5 of any of the spin-orbit torque magnetoresistance effect elements 101 and thus a write operation is performed. Furthermore, when a predetermined value or more of a voltage difference is applied between one of the read lines RL1 to RL3 and one of the bit lines BL1 to BL3, a current flows in a lamination direction in which a functional unit 4 is laminated in any of the spin-orbit torque magnetoresistance effect elements 101 and thus a read operation is performed. Data of any element is read out from the plurality of spin-orbit torque magnetoresistance effect elements 101; and thereby, the plurality of spin-orbit torque magnetoresistance effect elements 101 can be utilized as a magnetic memory.

Figure 10:
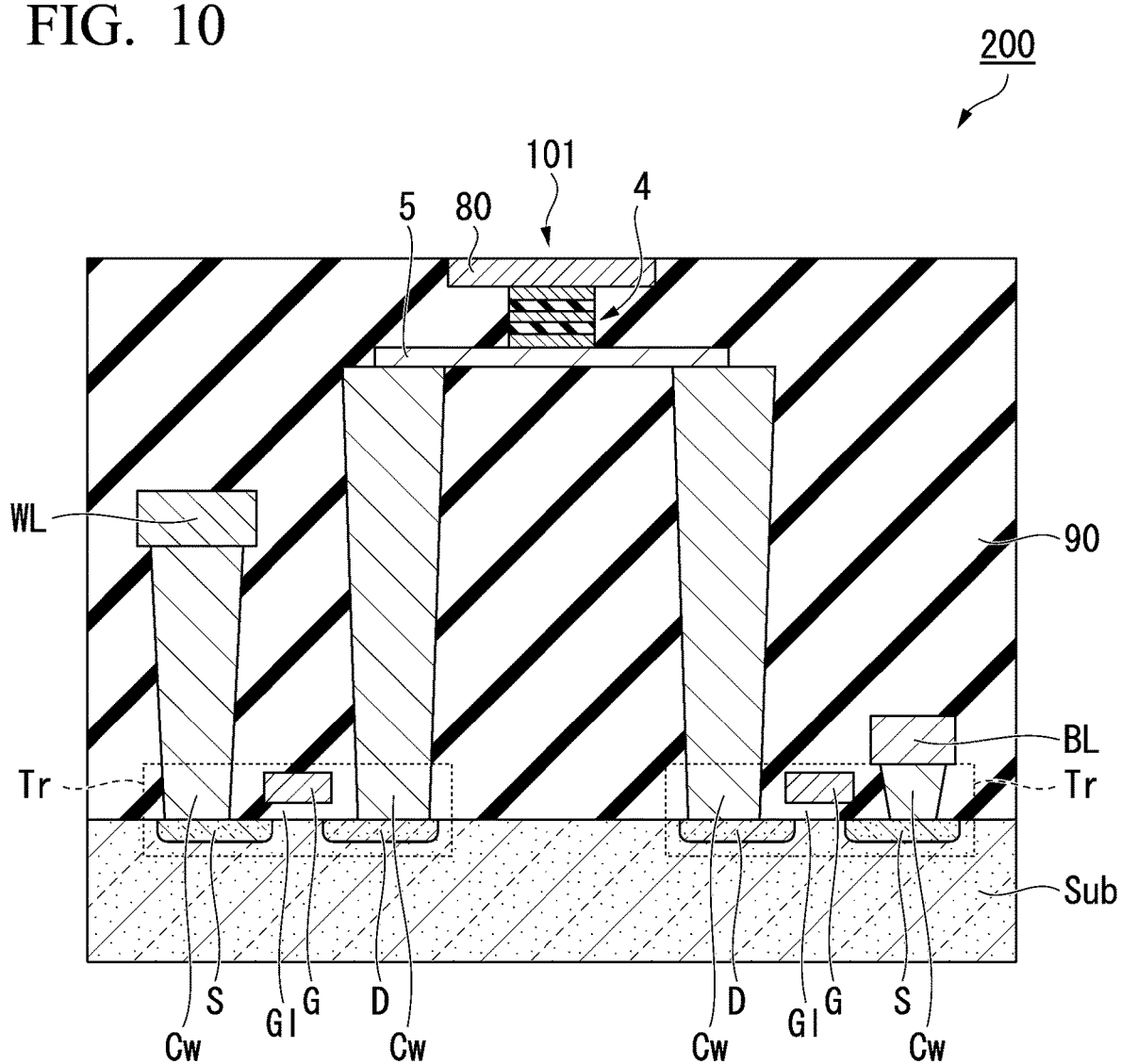
FIG. 10 is a schematic cross-sectional view of a main part of the magnetic memory according to the second embodiment.

FIG. 10 is a cross-sectional view of a main part of the magnetic memory 200 cut along surface A-A. The magnetic memory 200 includes the spin-orbit torque magnetoresistance effect elements 101 and a plurality of switching elements connected to the spin-orbit torque magnetoresistance effect elements 101.

The switching elements illustrated in FIG. 10 are transistors Tr. Each of the transistors Tr includes a gate electrode G, a gate insulating film GI, and a source region S and a drain region D formed on a substrate Sub. The substrate Sub is, for example, a semiconductor substrate.

Each of the transistors Tr is electrically connected to the spin-orbit torque magnetoresistance effect element 101, the word line WL, and the bit line BL via a conductive section Cw. The conductive section Cw may be referred to as, for example, a connection wiring or a via wiring in some cases. The conductive section Cw includes a material having conductivity. The conductive section Cw extends in the z direction.

Also, an electrode 80 is formed on the functional unit 4 of the spin-orbit torque magnetoresistance effect element 101. The electrode 80 includes a material having conductivity. The electrode 80 is connected to the read line RL. A switching element (for example, a transistor) may be provided between the read line RL and the electrode 80. The switching element between the read line RL and the electrode 80 is positioned, for example, in a paper depth direction (in the −y direction) in FIG. 10.

A storage element 100 is electrically isolated from a transistor Tr using an insulating layer 90 except for the conductive section Cw.

The magnetic memory 200 according to the second embodiment includes a plurality of the spin-orbit torque magnetoresistance effect elements 101 according to the first embodiment. As described above, each of the spin-orbit torque magnetoresistance effect elements 101 has a small inversion current density. Therefore, the magnetic memory 200 can be driven with low electric power consumption.

EXPLANATION OF REFERENCE SIGNS

1 . . . First ferromagnetic layer
2 . . . Second ferromagnetic layer
3 . . . Non-magnetic layer
4 . . . Functional unit 5 . . . Spin-orbit torque wiring
10a . . . First laminate structure
10b . . . Second laminate structure
11a, 11b . . . Ferromagnetic conductor layer
12a, 12b . . . Oxide-containing layer
20 . . . Interfacial magnetic layer
30 . . . Diffusion prevention layer
101, 102, 103 . . . Spin-orbit torque magnetoresistance effect element
200 . . . Magnetic memory

The invention claimed is:

1. A spin-orbit torque magnetoresistance effect element, comprising:
a first ferromagnetic layer;
a second ferromagnetic layer;
a non-magnetic layer positioned between the first ferromagnetic layer and the second ferromagnetic layer; and
a spin-orbit torque wiring on which the first ferromagnetic layer is laminated,
wherein the spin-orbit torque wiring extends in a second direction crossing a first direction which is an orthogonal direction of the first ferromagnetic layer,
the first ferromagnetic layer includes a first laminate structure and an interfacial magnetic layer in order from the spin-orbit torque wiring side,
the first laminate structure is a structure obtained by arranging a ferromagnetic conductor layer and an oxide-containing layer in order from the spin-orbit torque wiring side,
the ferromagnetic conductor layer includes a ferromagnetic metal element, and
the oxide-containing layer includes an oxide of a ferromagnetic metal element.

2. The spin-orbit torque magnetoresistance effect element according to claim 1, wherein the ferromagnetic metal element of the oxide included in the oxide-containing layer is the same as the ferromagnetic metal element included in the ferromagnetic conductor layer.

3. The spin-orbit torque magnetoresistance effect element according to claim 1, wherein at least one second laminate structure in which a ferromagnetic conductor layer and an oxide-containing layer are laminated is inserted between the first laminate structure and the interfacial magnetic layer.

4. The spin-orbit torque magnetoresistance effect element according to claim 3, wherein a film thickness of the ferromagnetic conductor layer in the first laminate structure is larger than a film thickness of the ferromagnetic conductor layer in the second laminate structure.

5. The spin-orbit torque magnetoresistance effect element according to claim 1, wherein a film thickness of the oxide-containing layer is 1.0 nm or less.

6. The spin-orbit torque magnetoresistance effect element according to claim 1, wherein the oxide contained in the oxide-containing layer contains insufficient oxygen with respect to a stoichiometric composition.

7. The spin-orbit torque magnetoresistance effect element according to claim 1, wherein the first ferromagnetic layer includes a diffusion prevention layer and the diffusion prevention layer is positioned on a surface of the interfacial magnetic layer on a side thereof opposite to a side thereof in contact with the non-magnetic layer.

8. The spin-orbit torque magnetoresistance effect element according to claim 1, wherein the interfacial magnetic layer includes at least one element selected from the group consisting of Co, Fe, and B.

9. A magnetic memory, comprising:
a plurality of the spin-orbit torque magnetoresistance effect elements according to claim 1.

10. The spin-orbit torque magnetoresistance effect element according to claim 2, wherein at least one second laminate structure in which a ferromagnetic conductor layer and an oxide-containing layer are laminated is inserted between the first laminate structure and the interfacial magnetic layer.

11. The spin-orbit torque magnetoresistance effect element according to claim 10, wherein a film thickness of the ferromagnetic conductor layer in the first laminate structure is larger than a film thickness of the ferromagnetic conductor layer in the second laminate structure.

12. The spin-orbit torque magnetoresistance effect element according to claim 2, wherein a film thickness of the oxide-containing layer is 1.0 nm or less.

13. The spin-orbit torque magnetoresistance effect element according to claim 3, wherein a film thickness of the oxide-containing layer is 1.0 nm or less.

14. The spin-orbit torque magnetoresistance effect element according to claim 2, wherein the oxide contained in the oxide-containing layer contains insufficient oxygen with respect to a stoichiometric composition.

15. The spin-orbit torque magnetoresistance effect element according to claim 3, wherein the oxide contained in the oxide-containing layer contains insufficient oxygen with respect to a stoichiometric composition.

16. The spin-orbit torque magnetoresistance effect element according to claim 2, wherein the first ferromagnetic layer includes a diffusion prevention layer and the diffusion prevention layer is positioned on a surface of the interfacial magnetic layer on a side thereof opposite to a side thereof in contact with the non-magnetic layer.

17. The spin-orbit torque magnetoresistance effect element according to claim 3, wherein the first ferromagnetic layer includes a diffusion prevention layer and the diffusion prevention layer is positioned on a surface of the interfacial magnetic layer on a side thereof opposite to a side thereof in contact with the non-magnetic layer.

18. The spin-orbit torque magnetoresistance effect element according to claim 2, wherein the interfacial magnetic layer includes at least one element selected from the group consisting of Co, Fe, and B.

19. The spin-orbit torque magnetoresistance effect element according to claim 3, wherein the interfacial magnetic layer includes at least one element selected from the group consisting of Co, Fe, and B.

20. A magnetic memory, comprising:
a plurality of the spin-orbit torque magnetoresistance effect elements according to claim 2.

* * * * *